United States Patent
Ono (10) Patent No.: US 7,555,702 B2
(45) Date of Patent: Jun. 30, 2009

(54) ERROR CORRECTION DEVICE, ERROR CORRECTION PROGRAM AND ERROR CORRECTION METHOD

(75) Inventor: Kana Ono, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 518 days.

(21) Appl. No.: 11/351,514

(22) Filed: Feb. 10, 2006

(65) Prior Publication Data

US 2007/0136646 A1 Jun. 14, 2007

(30) Foreign Application Priority Data

Nov. 25, 2005 (JP) ............................. 2005-339635

(51) Int. Cl.
*H03M 13/00* (2006.01)
(52) U.S. Cl. ...................................... 714/781
(58) Field of Classification Search ................. 714/781
See application file for complete search history.

(56) References Cited

U.S. PATENT DOCUMENTS

| | | | | |
|---|---|---|---|---|
| 5,541,939 | A * | 7/1996 | Im ............................... | 714/765 |
| 5,608,740 | A * | 3/1997 | Watanabe ..................... | 714/755 |
| 6,704,902 | B1 * | 3/2004 | Shinbashi et al. ............ | 714/785 |
| 7,055,087 | B2 * | 5/2006 | Kwon et al. ................. | 714/784 |
| 7,111,222 | B2 * | 9/2006 | Takagi et al. ................ | 714/755 |
| 7,222,287 | B2 * | 5/2007 | Kondou ....................... | 714/784 |

FOREIGN PATENT DOCUMENTS

| | | |
|---|---|---|
| EP | 1 370 003 | 12/2003 |
| JP | 5-315974 | 11/1993 |
| JP | 2001-101020 | 4/2001 |
| WO | WO 00/57561 | 9/2000 |
| WO | WO 00/57561 A1 | 9/2000 |

OTHER PUBLICATIONS

"Design of the (248,216) Reed-Solomon Decoder with Erasure Correction for Blu-ray disc," XP002430971, Database Accession No. 8593094, IEEE Transactions on Consumer Electronics IEEE USA, vol. 51, No. 3, Aug. 2005.

* cited by examiner

*Primary Examiner*—Guy J Lamarre
*Assistant Examiner*—Sam Rizk
(74) *Attorney, Agent, or Firm*—Greer, Burns & Crain, Ltd.

(57) ABSTRACT

An error correction device, an error correction program and an error correction method can reduce the processing time necessary for the process of correcting errors that involve erasure in a reception word by using a software and hardware properly and effectively. As an error-correcting circuit for correcting errors that do not involve erasure receives a reception word that involves erasure from an RDC, an erasure information holding section holds the erasure information and a syndrome generating section generates a syndrome from the reception word so that a erasure judging section transmits the erasure information and the syndrome to an MPU. In the MPU, an erasure error value computing section and erasure correcting section correct only erasure and store the reception word that does not involve erasure in an RAM. The reception word from the RAM is input again to the error-correcting circuit for correcting errors that do not involve erasure by way of a data bus and a switch. The erasure judging section judges the reception word as one that does not involve erasure and has Chien search section and an error-correcting section correct errors.

14 Claims, 4 Drawing Sheets

DATA POSITION

| 1 | 2 | 3 | 4 | 5 | 6 | 7 | 8 | 9 | 10 | 11 | 12 | 13 | 14 |

11~ CORRECT DATA

| 1 | 0 | 1 | 0 | 1 | 0 | 1 | 0 | 1 | 0 | 1 | 0 | 1 | 0 |

12~ RECEPTION WORD (CODE WORD CONTAINING FOUR ERRORS IS RECEIVED)

| 1 | 0 | 1 | 1 | 1 | 1 | 1 | 0 | 1 | 1 | 0 | 0 | 1 | 0 |

13~ ERASURE INFORMATION FOR RECEPTION WORD (1 INDICATES ERASURE, 2 VANISHED DATA)

| 0 | 0 | 0 | 0 | 0 | 0 | 0 | 0 | 0 | 1 | 1 | 0 | 0 | 0 |

14~ DATA CORRECTED ONLY FOR ERASURE (2 VANISHED DATA ARE CORRECTED TO MAKE NUMBER OF REMAINING ERRORS EQUAL TO 2)

| 1 | 0 | 1 | 1 | 1 | 1 | 1 | 0 | 1 | 0 | 1 | 0 | 1 | 0 |

15~ DATA CORRECTED FOR ERRORS (CAN BE CORRECTED BECAUSE NUMBER OF REMAINING ERRORS IS NOT GREATER THAN 3)

| 1 | 0 | 1 | 0 | 1 | 0 | 1 | 0 | 1 | 0 | 1 | 0 | 1 | 0 |

ERROR CORRECTION DEVICE, ERROR CORRECTION PROGRAM AND ERROR CORRECTION METHOD

BACKGROUND OF THE INVENTION

1. Field of the Invention

This invention relates to an error correction device, an error correction program and an error correction method for correcting one or more than one errors that appear in received data.

2. Description of the Related Art

The data that are exchanged between apparatus can become error data as noises get mixed with the data. Then, the errors are corrected by means of an error correcting code. Error corrections performed by error correction devices can be sorted into those that involve erasure and those that do not involve any erasure.

An error correction device in a disk drive will be described below as an example of error correction device. Erasure information includes information on TAs (thermal asperities: error signals produced by temperature) and code violations from the RDC (read channel) and information given from the MPU (micro processing unit). Erasure information is given before the start of an error-correcting operation and, when erasure is involved, the software of the MPU or the like intervenes in the error-correcting operation. In the error-correcting operation, if an error-correcting code can maximally correct $t$ errors when erasure is not involved, it can maximally correct $t \times 2$ errors when erasure is involved.

Figure 4:
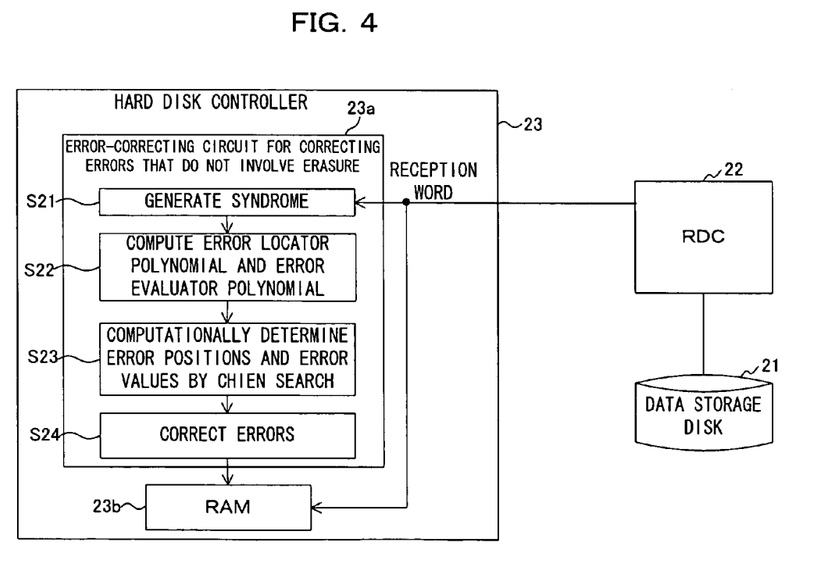
FIG. 4 is a schematic conceptual illustration of the configuration and the flow of operation of a prior art error correction device for correcting errors that do not involve erasure.

Firstly, correction of errors that do not involve erasure will be described. FIG. 4 of the accompanying drawings is a conceptual illustration of a known error correction device for errors that do not involve erasure and the flow of the operation of the device. As shown in FIG. 4, with an error correction device for errors that do not involve erasure, the RDC 22 generates a reception word by converting the analog signal from the data storage disk 21 into a 10-bit digital signal. Additionally, the RDC 22 inputs the reception word to the error-correcting circuit 23a for errors that do not involve erasure of the hard disk controller 23 for error correction. Note that the error-correcting circuit 23a for errors that do not involve erasure is formed by hardware.

The error-correcting circuit 23a for errors that do not involve erasure executes an error-correcting operation in the following sequence. Firstly, the error-correcting circuit 23a for errors that do not involve erasure generates a syndrome that gives a cue for error correction from the reception word received from the RDC 22 (Step S21). Then, the error-correcting circuit 23a for errors that do not involve erasure carries out the computation of an error locator polynomial and an error evaluator polynomial according to the generated syndrome (Step S22). Thereafter, the error-correcting circuit 23a for errors that do not involve erasure computationally determines the error positions and the error values by Chien search, using the two polynomials including the error locator polynomial and the error evaluator polynomial (Step S23).

Then, the error-correcting circuit 23a for errors that do not involve erasure performs an error-correcting operation on the reception word according to the error positions and the error values that are computationally determined and writes the outcome of the operation in the RAM (random access memory) 23b (Step S24). All the operations of the above Step S21 through S24 are carried out by hardware. As the error-correcting process is executed by hardware, the processing time required for the error correction is short.

Figure 5:
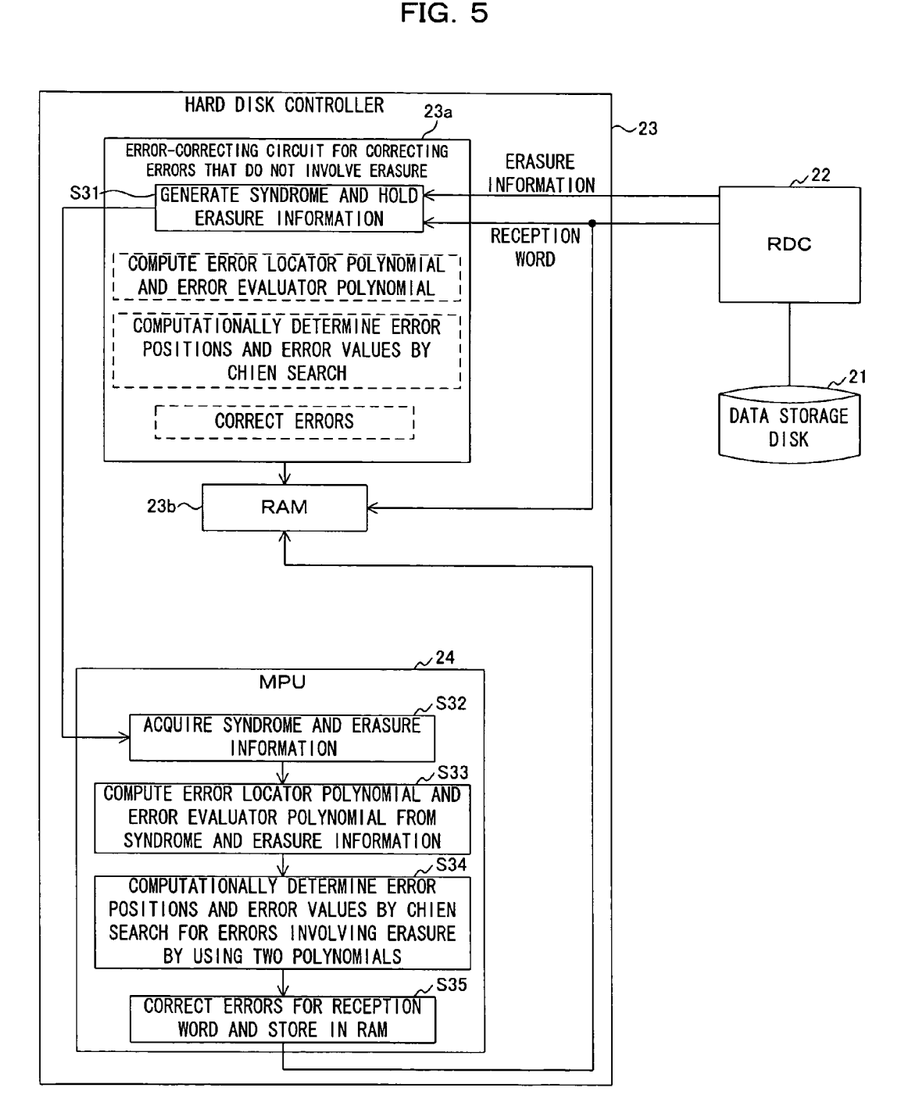
FIG. 5 is a schematic conceptual illustration of the configuration and the flow of operation of a prior art error correction device for correcting errors that involve erasure.

Now, correction of errors that involve erasure will be described below. FIG. 5 of the accompanying drawings is a conceptual illustration of a known error correction device for errors that involve erasure and the flow of the operation of the device. As shown in FIG. 5, with an error correction device for errors that involve erasure, the RDC 22 generates a reception word by converting the analog signal from the data storage disk 21 into a 10-bit digital signal and, at the same time, detects erasure in the reception word to generate erasure information. Then, the RDC 22 inputs the reception word and the erasure information to the error-correcting circuit 23a for errors that involves erasure of the hard disk controller 23. A circuit same as the error-correcting circuit 23a for errors that do not involve erasure of the error correction device for errors that do not involve erasure as illustrated in FIG. 4 is used in the error correction device for errors that involve erasure shown in FIG. 5.

In the error correction device for errors that involve erasure illustrated in FIG. 5, while the error correcting-circuit 23a for errors that do not involve erasure of the hard disk controller 23 receives erasure information and a reception word from the RDC 22, generates a syndrome and holds the erasure information (Step S31), it does not have the functional feature of executing a step of carrying out the computation of an error locator polynomial and an error evaluator polynomial (corresponding to Step S22 in FIG. 4), a step of computationally determining the error positions and the error values by Chien search (corresponding to Step S23 in FIG. 4) and a step of performing an error-correcting operation on the reception word (corresponding to Step S24 in FIG. 4). Since correction of errors that involve erasure requires a huge circuit if it is to be performed by means of hardware, it is necessary to provide an MPU 24 that is dedicated to execution of a program designed only for an error-correcting process of correcting errors that involve erasure as shown in FIG. 5.

Thus, the operation of correcting errors that involve erasure to be performed by an error correction device for errors that involve erasure follows the sequence as described below. Firstly, as described above, the error-correcting circuit 23a for errors that do not involve erasure of the hard disk controller 23 receives erasure information and a reception word from the RDC 22 and holds the erasure information (Step S31). Then, the MPU 24 dedicated to an error-correcting process of correcting errors that involve erasure acquires the syndrome and the erasure information from the error-correcting circuit 23a for errors that do not involve erasure (Step S32) and carries out the computation of an error locator polynomial and an error evaluator polynomial according to the syndrome and the erasure information (Step S33). Additionally, the MPU 24 computationally determines the error positions and the error values for errors that involve erasure by Chien search, using the two polynomials including the error locator polynomial and the error evaluator polynomial (Step S34). Then, the MPU 24 carries out an error-correcting operation on the reception word and writes the outcome of the operation in the RAM 13b (Step S35). Note that Step S34 (of computationally determining the error positions and the error values by Chien search) and Step S35 (of correcting errors) do not discriminate errors involving erasure and other errors and hence are applied to all errors.

For correction of errors that involve erasure, the error-correcting circuit 23a for errors that do not involve erasure (which is hardware) is only responsible for Step S31 of generating a syndrome and holding erasure information whereas the MPU 24 (which is software) is responsible for the steps from Step S32 of acquiring the syndrome and the erasure information to the Step S35 of carrying out an error-correcting operation. In this way, hardware and software share the responsibility of correcting errors that involve erasure.

The prior art that relates to the present invention includes the technique disclosed in Patent Document 1 [Jpn. Pat. Appln. Laid-Open Publication No. 2001-101020 (see Paragraphs 0137 through 0138 and FIG. 1)]. With the disclosed technique, it is possible to carry out an error-correcting operation of correcting errors that involve erasure at high speed, while minimizing the increase of the circuit size of the hardware, by using an MPU for correction of errors of erased data.

However, for correction of errors that involve erasure, when the MPU 24, which is software, corrects errors that involve erasure by Chien search in Step S34 of FIG. 5, it has to check all the data positions where an error can take place to see if each of the data positions is actually an error position or not. This checking operation requires a long processing time. In other words, since Chien search operation is conducted for all the data positions by means of software like a round robin event, it takes a long time to carry out the Chien search operation and computationally determines all the error positions and all the error values, including those involving erasure. As a result, the process of correcting errors involving erasure entails a long processing time.

SUMMARY OF THE INVENTION

In view of the above-identified problem, it is therefore an object of the present invention to provide an error correction device, an error correction program and an error correction method that can reduce the processing time necessary for the process of correcting errors that involve erasure in a reception word by using software and hardware properly and effectively.

In an aspect of the present invention, the above object is achieved by providing an error correction device for correcting errors of a code word according to the code word and erasure information it acquires, the device comprising: a erasure judging section that executes a software for judging if the code word involves erasure or not according to the erasure information; a syndrome generating section that is a hardware for generating a syndrome for the code word; an erasure correcting section that is a software that corrects the code word for erasure according to the syndrome generated by the syndrome generating section and the erasure information when the erasure judging section judges that the code word involves erasure and causes the syndrome generating section to generate a syndrome for the code word that is corrected for erasure; and an erasure-free error-correcting section that is a hardware for correcting errors that do not involve erasure according to the syndrome generated by the syndrome generating section.

Preferably, in the error correction device according to the invention, the syndrome generating section generates a syndrome for the acquired code word and delivers the outcome to the erasure-free error-correcting section when the erasure judging section judges that the code word does not involve erasure but firstly generates a syndrome for the acquired code word and delivers the outcome to the erasure correcting section when the erasure judging section judges that the code word involves erasure and it further generates a syndrome for the code word corrected by the erasure correcting section and delivers the outcome to the erasure-free error-correcting section.

Preferably, in the error correction device according to the invention, the erasure-free error-correcting section carries out the computation of an error locator polynomial and an error evaluator polynomial and Chien search according to the syndrome generated by the syndrome generating section.

Preferably, in the error correction device according to the invention, the erasure correcting section carries out the computation of an error locator polynomial and an error evaluator polynomial according to the syndrome generated by the syndrome generating section and the erasure information.

In another aspect of the present invention, there is provided an error correction program for causing a computer to correct errors of a code word according to the code word and erasure information it acquires, the program comprising: a syndrome generating step that causes a hardware for generating a syndrome to generate a syndrome for the code word; an erasure judging step that judges if the code word involves erasure or not according to the erasure information; an erasure correcting step that corrects the erasure according to the syndrome generated from the code word and the erasure information when the erasure judging step judges that the code word involves erasure; a post-erasure-correction syndrome generating step that causes the hardware for generating a syndrome to generate a syndrome for the code word corrected by the erasure correcting step; and a post-erasure-correction error correcting step that causes the hardware for correcting errors that do not involve erasure to correct the errors of the code word corrected by the erasure correcting step according to the syndrome generated by the post-erasure-correction syndrome generating step.

Preferably, the error correction program according to the invention further comprises: an erasure-free error-correcting step that causes the hardware for correcting errors that do not involve erasure to correct the errors of the code word according to the syndrome generated by the syndrome generating step when the erasure judging step judges that the code word does not involve erasure.

Preferably, in the error correction program according to the invention, the hardware for correcting errors that do not involve erasure in the post-erasure-correction error correcting step carries out the computation of an error locator polynomial and an error evaluator polynomial and Chien search according to the syndrome generated by the syndrome generating step.

Preferably, in the error correction program according to the invention, the hardware for correcting errors that do not involve erasure in the erasure-free error correcting step carries out the computation of an error locator polynomial and an error evaluator polynomial and Chien search according to the syndrome generated by the syndrome generating step or the syndrome regenerating step.

Preferably, in the error correction program according to the invention, the erasure correcting step carries out the computation of an error locator polynomial and an error evaluator polynomial according to the syndrome generated by the syndrome generating step and the erasure information.

In still another aspect of the present invention, there is provided an error correction method for correcting errors of a code word according to the code word and the erasure information it acquires, the method comprising: a syndrome generating step that causes a hardware for generating a syndrome to generate a syndrome for the code word; an erasure judging step that judges if the code word involves erasure or not according to the erasure information; an erasure correcting step that corrects the erasure according to the syndrome generated from the code word and the erasure information when the erasure judging step judges that the code word involves erasure; a post-erasure-correction syndrome generating step that causes the hardware for generating a syndrome to generate a syndrome for the code word corrected by the erasure correcting step; and a post-erasure-correction error correcting step that causes a hardware for correcting errors that do not involve erasure to correct the errors of the code word corrected by the erasure correcting step according to the syndrome generated by the post-erasure-correction syndrome generating step.

Preferably, the error correction method according to the invention further comprises: an erasure-free error-correcting step that causes the hardware for correcting errors that do not involve erasure to correct the errors of the code word according to the syndrome generated by the syndrome generating step when the erasure judging step judges that the code word does not involve erasure.

Preferably, in the error correction method according to the invention, the hardware for correcting errors that do not involve erasure in the post-erasure-correction error correcting step carries out the computation of an error locator polynomial and an error evaluator polynomial and Chien search according to the syndrome generated by the syndrome generating step.

Preferably, in the error correction method according to the invention, the hardware for correcting errors that do not involve erasure in the erasure-free error correcting step carries out the computation of an error locator polynomial and an error evaluator polynomial and Chien search according to the syndrome generated by the syndrome generating step or the syndrome regenerating step.

Preferably, in an error correction method according to the invention, the erasure correcting step carries out the computation of an error locator polynomial and an error evaluator polynomial according to the syndrome generated by the syndrome generating step and the erasure information.

Thus, according to the present invention, it is possible to reduce the processing time necessary for the process of correcting errors that involve erasure, while maintaining the circuit size of the error correction circuit to the level of the prior art.

DETAILED DESCRIPTION OF THE PREFERRED EMBODIMENTS

Now, an embodiment of error correction device according to the invention will be described below by referring to the accompanying drawings. Firstly, an error correction device according to the invention will be summarily described. When correcting errors of a reception word (code word) that involve erasure, an error correction device according to the invention carries out the computations relating to erasure and the operation of correcting the erasure by means of software and carries out the computations for errors that do not involve erasure and the operation of correcting the errors by means of hardware. In other words, it corrects errors that involve erasure by using software and hardware properly and effectively. With this arrangement, it is possible to remarkably reduce the processing time necessary for the software to correcting errors that involve erasure because the hardware is responsible for Chien search for error data.

Figure 1:
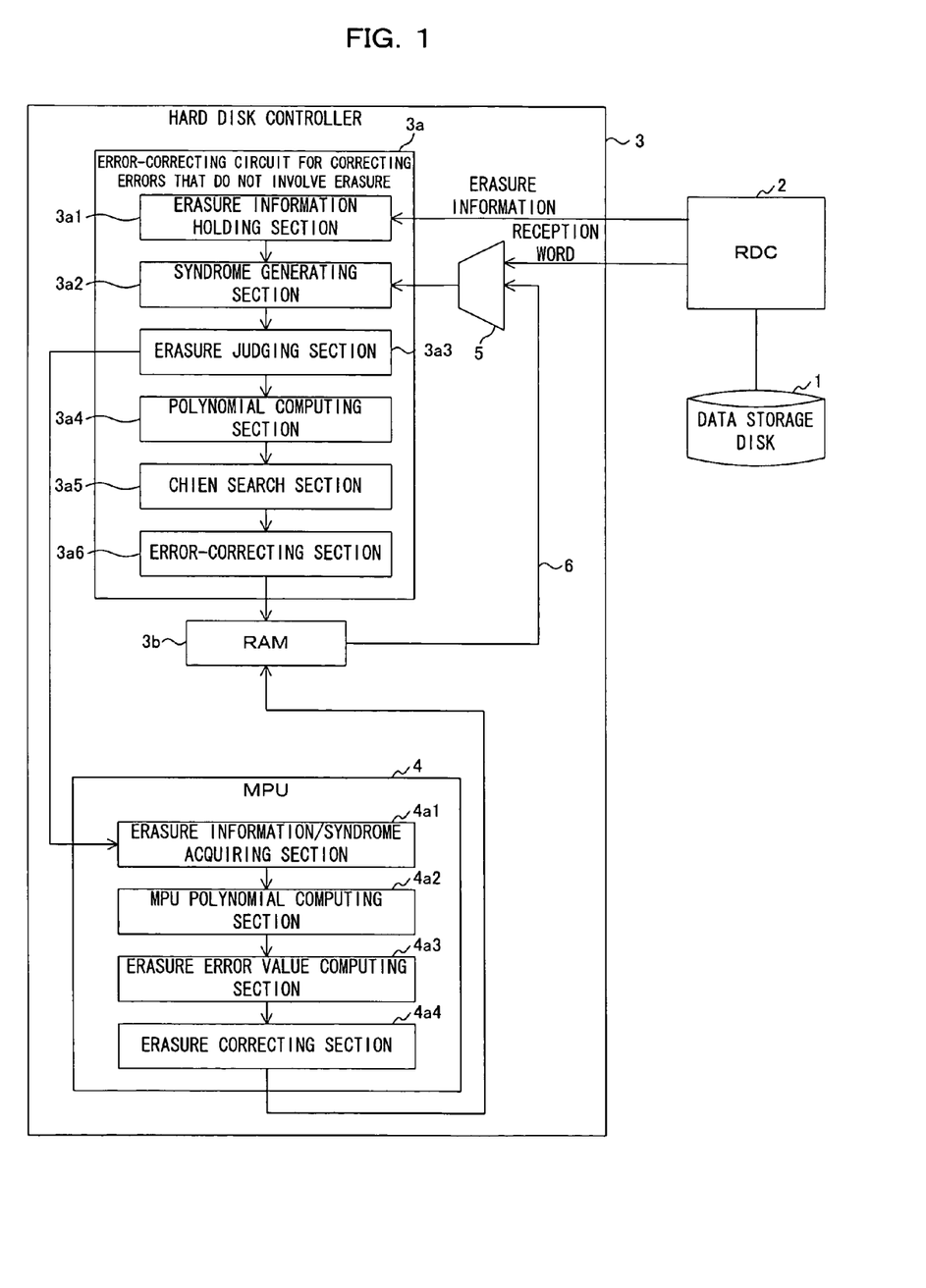
FIG. 1 is a schematic block diagram of an embodiment of error correction device according to the invention, illustrating the configuration thereof.

Now, a preferable embodiment of error correction device according to the invention will be described in greater detail. FIG. 1 is a schematic block diagram of an embodiment of error correction device according to the invention, illustrating the configuration thereof. Referring to FIG. 1, the embodiment of error correction device according to the invention comprises a data storage disk 1, an RDC (read channel) 2 and a hard disk controller 3. The hard disk controller 3 by turn includes an error-correcting circuit 3a for correcting errors that do not involve erasure, a RAM 3b, an MPU 4, a switch 5 and a data bus 6 that is specific to the present invention.

The error-correcting circuit 3a for correcting errors that do not involve erasure by turn has an erasure information holding section 3a1 for holding erasure information on a reception word, a syndrome generating section 3a2 for generating and holding a syndrome of the reception word, an erasure judging section 3a3 for judging if erasure is involved in the reception word according to the erasure information, a polynomial computing section 3a4 for computing an error locator polynomial and an error evaluator polynomial, Chien search section 3a5 for retrieving error positions by Chien search and computing error values and an error-correcting section 3a6 for correcting errors for the RAM 3b from the outcome of retrieving error positions and computing error values.

The error-correcting circuit 3a for correcting errors that do not involve erasure corrects errors by using all the above listed-means 3a1 through 3a6 when it corrects errors that do no involve erasure. However, when it corrects errors that involve erasure, it does not use the functions of the polynomial computing section 3a4, the Chien search section 3a5 and the error-correcting section 3a6 but delivers the erasure information and the syndrome to the MPU 4 from the error-correcting circuit 3a for correcting errors that does not involve erasure. Then, the MPU 4 corrects only erasure according to the erasure information and the syndrome. Then, the MPU 4 stores the outcome of the correction in the RAM 3b and retransmits it to the error-correcting circuit 3a as reception word that does not involve erasure. As a result, the error-correcting circuit 3a for correcting errors that do not involve erasure can handle it as reception word that does not involve erasure and executes an error-correcting process by using the functions of the polynomial computing section 3a4, the Chien search section 3a5 and the error-correcting section 3a6.

Thus, the RAM 3b stores reception words that can be accessed from the error-correcting circuit 3a for correcting errors that do not involve erasure and the MPU 4. Additionally, the RAM 3b and the switch 5 are connected by the data bus 6 and the reception word that does not involve erasure and output from the RAM 3b is transmitted to the switch 5.

The switch 5 has a function of appropriately switching from the reception word transmitted from the data storage disk 1 by way of the RDC 2 to the reception word that does not involve erasure and retransmitted from the RAM 3b or vice versa and transmitting the selected one to the syndrome generating section 3a2 of the error-correcting circuit 3a for correcting errors that do not involve erasure.

The MPU 4 has a function of acquiring a syndrome and erasure information from the error-correcting circuit 3a for correcting errors that do not involve erasure, correcting erasure and reading data to and writing data from the RAM 3b. More specifically, the MPU 4 includes an erasure information/syndrome acquiring section 4a1 for acquiring a syndrome and erasure information on a reception word from the error-correcting circuit 3a for correcting errors that do not involve erasure, an MPU polynomial computing section 4a2 for computing the error locator polynomial and the error evaluator polynomial from the syndrome and the erasure information, an erasure error value computing section 4a3 for computing the error value of erasure from the outcome of the computation of the error locator polynomial and the error evaluator polynomial and an erasure correcting section 4a4 for correcting erasure for the RAM 3b.

Figure 2:
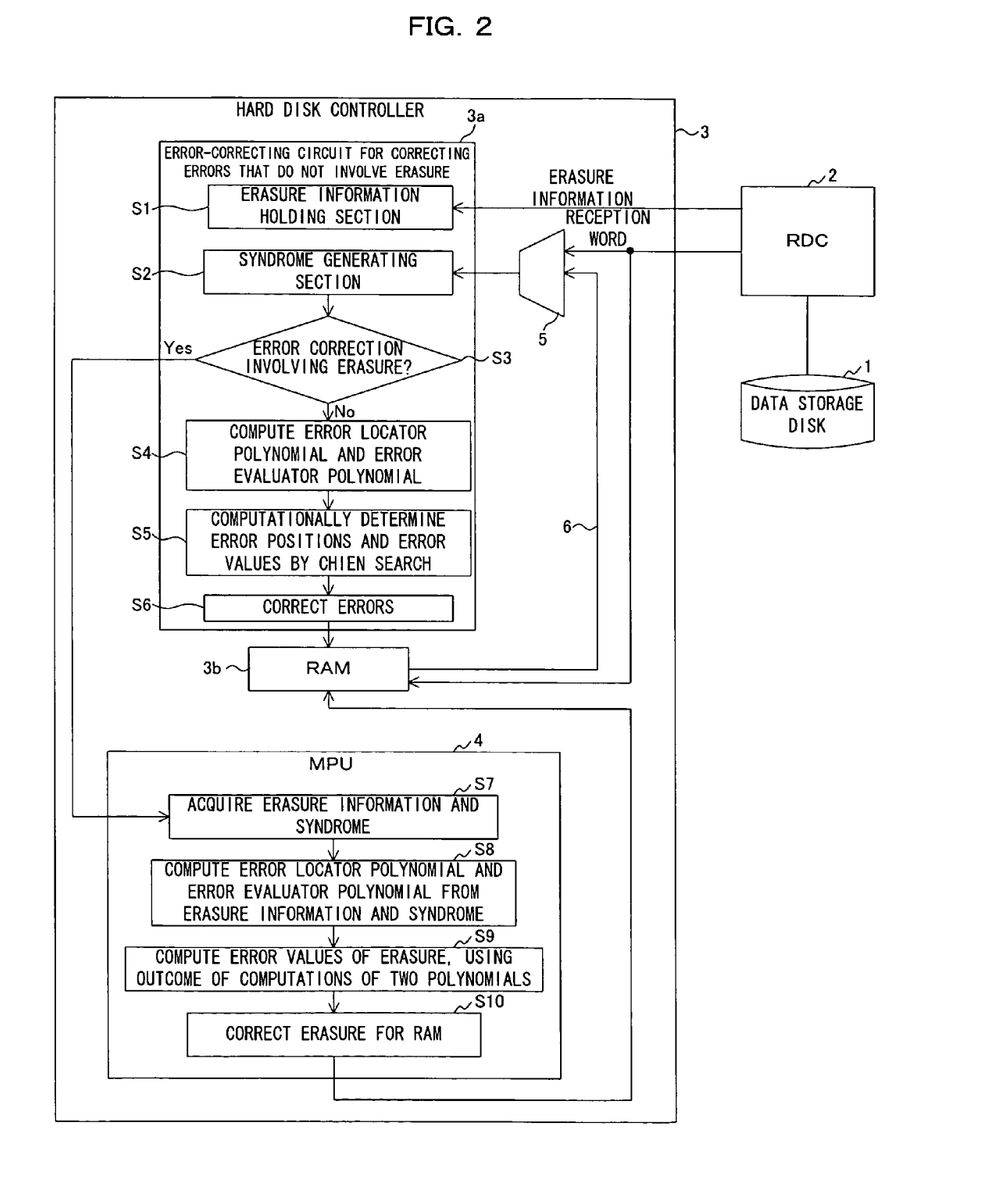
FIG. 2 is a schematic conceptual illustration of the configuration and the flow of operation of the embodiment of error correction device of FIG. 1.

Now, the operation of the embodiment of error correction device according to the invention will be described below by referring to the flowcharts for it. FIG. 2 is a schematic conceptual illustration of the configuration and the flow of operation of error correction device of the present invention. Note that, since the process of correcting errors that involve erasure is executed over the components of the error correction device of FIG. 1, the flowchart of FIG. 2 is drawn in the related components so that it may be understood with ease.

The process of correcting errors that involve erasure includes the part to be executed by the hardware and the part to be executed by the software and hence follows the sequence as described blow. Firstly, the error-correcting circuit 3a for correcting errors that do not involve erasure holds the erasure information on the reception word transmitted from the RDC 2 (Step S1). Additionally, the error-correcting circuit 3a for correcting errors that do not involve erasure receives the reception word transmitted from the RDC 2 by way of the switch 5 and generates a syndrome, which it holds (Step S2).

Then, the error-correcting circuit 3a for correcting errors that do not involve erasure determines if it corrects errors that involve erasure or not according to the erasure information (Step S3) and, if it determines that it does not correct errors that involve erasure (Step S3, No), it computes the error locator polynomial and the error evaluator polynomial (Step S4) and also computationally determines the error positions and the error values by Chien search (Step S5). Thereafter, it stores the error correction data obtained as a result of the computations on the error positions and the error values for the RAM 3b.

If, on the other hand, the error-correcting circuit 3a determines in Step S3 that it corrects errors that involve erasure (Step S3, Yes), which means that the received reception word is accompanied by erasure information or that the erasure information from the MPU4 is added for the error correction, the MPU 4 that is software acquires the erasure information on the reception word and the syndrome from the error-correcting circuit 3a for correcting errors that do not involve erasure that is hardware (Step S7) and computes the error locator polynomial and the error evaluator polynomial from the erasure information and the syndrome (Step S8).

Additionally, the MPU 4 computes the error values of erasure from the outcome of the computation of the error locator polynomial and the error evaluator polynomial and the erasure. The number of error values of erasure that need to be computed is made not smaller than the difference obtained by subtracting the number t that can be amended by the hardware (the error-correcting circuit 3a for correcting errors that do not involve erasure) from the total number of errors (Step S9). Then, the MPU 4 corrects the received data by using the value of erasure determined in Step S9 and also the data stored in the RAM 3b for the errors of erasure (Step S10).

Then, the MPU 4 transmits the reception word (that is corrected for the errors of erasure) stored in the RAM 3b to the switch 5 by way of the data bus 6. Then, the switch 5 performs a switching operation to transmit the reception word (that is corrected for the errors of erasure) from the RAM 3b to the error-correcting circuit 3a for correcting errors that do not involve erasure. As a result, the error-correcting circuit 3a for correcting errors that do not involve erasure corrects errors that do not involve erasure for the received data (the reception word that is corrected for the errors of erasure).

In this way, by receiving the reception word that does not involve erasure from the RAM 3b, the error-correcting circuit 3a for correcting errors that do not involve erasure determines that it corrects errors that do not involve erasure in Step S3 (Step S3, No). Thus, the error-correcting circuit 3a for correcting errors that do not involve erasure computes the error locator polynomial and the error evaluator polynomial as in the case of the reception word that is received from the RDC 2 and does not involve erasure (Step S4) and also computationally determines the error positions and the error values by Chien search (Step S5). Thereafter, it corrects errors for the RAM 3b from the outcome of the computations on the error positions and the error values for the RAM 3b (Step S6).

In other words, for correcting errors that involve erasure, the MPU 4 corrects only erasure and the reception word is retransmitted to the error-correcting circuit 3a for correcting errors that do not involve erasure by way of the RAM 3b and the data bus 6 so that it can be processed for correcting errors that do not involve erasure.

Thus, the MPU 4 (software) is made responsible only for correcting erasure and the error-correcting section 3a (hardware) is made responsible for correcting errors that do not involve erasure. With this arrangement, the error-correcting section 3a for correcting errors that do not involve erasure is totally responsible for Chien search so that the time that needs to be spent for the Chien search and the operation of correcting errors that involve erasure is reduced.

Figure 3:
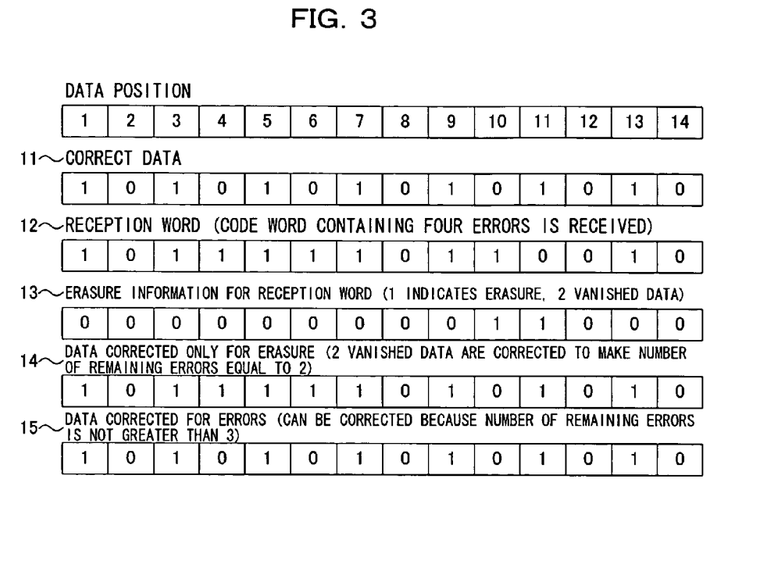
FIG. 3 is a schematic conceptual illustration of data to be corrected by the embodiment of error correction device of FIG. 1, illustrated as example.

FIG. 3 is a schematic conceptual illustration of data to be corrected by the embodiment of error correction device of FIG. 1, illustrated as example. The conceptual illustration of data shows how data are corrected for errors that do not involve erasure with an error-correcting ability of 3 bits.

Referring to FIG. 3, when correct data 11 are transmitted from the RDC 2, a reception word 12 that contains four error data located at data positions 4, 6, 10 and 11 is input to the error-correcting circuit 3a for correcting errors that do not involve erasure. Additionally, erasure information 13 is also input to the error-correcting circuit 3a for correcting errors that do not involve erasure. "1" in the erasure information 13 indicates erasure. In the illustrated example, the data at the data positions 10 and 11 are erasure.

Therefore, the MPU 4 corrects only the erasure and the data 14 corrected only for erasure are actually corrected only for the data at the data positions 10 and 11. In other words, the two data at the data positions 4 and 6 are left as wrong data. The data 14 corrected only for erasure are then stored in the RAM 3b from the MPU 4. Then, the data 14 corrected only for erasure are transmitted from the RAM 3b to the error-correcting circuit 3a for correcting errors that do not involve erasure by way of the data bus 6 and the switch 5.

Thus, the error-correcting circuit 3a for correcting errors that do not involve erasure corrects the data 14 corrected only for erasure (that do not involve erasure) and the data 15 corrected for errors that are corrected for the two data at the data positions 4 and 6 are stored in the RAM 3b. Since the error correcting ability of the error-correcting circuit 3a for correcting errors that do not involve erasure is 3 bits, the error-correcting circuit 3*a* for correcting errors that do not involve erasure can correct the data 14 corrected only for erasure that are 2-bit data and output the outcome of the error-correcting operation as data 15 corrected for errors. Thus, it is clear that the data 15 corrected for errors are same as the correct data 11.

In an error correction device according to the invention, the hardware (the error-correcting circuit for correcting errors that do not involve erasure receives back the data that are corrected for erasure by the software (MPU) in order to correct errors. In other words, the software (MPU) does not perform Chien search for correcting errors that involve erasure but computes the values of erasure according to the erasure information and corrects the erasure. Then, it turns the data into error data that do not involve erasure and subsequently the hardware (the error-correcting circuit for correcting errors that do not involve erasure) retrieves the error positions by Chien search and computationally determines the error values. With this arrangement, the software (MPU) does not perform any Chien search so that the error-correcting time is remarkably reduced.

Thus, with an error correction device according to the invention, it is possible to reduce the processing time necessary for the process of correcting errors that involve erasure, while maintaining the circuit size of the error correction circuit to the level of the prior art. More specifically, if the code length is N and the error-correcting ability for the code word is $\underline{t}$, the time required for the process of searching errors can be reduced to t/N times of the time required by the software of the prior art.

While a preferred embodiment of error correction device according to the invention is described above in terms of a disk device, the present invention is by no means limited thereto and the present invention can be applied to an error correction means to be used for an information apparatus or a communication apparatus of any type.

Additionally, according to the invention, there is provided an error correction program for causing a computer that operates as error correction device to execute the above-described steps. Such an error correction program can be executed by a computer that operates as error correction device when the program is stored in a computer-readable remaining medium. Computer-readable recording mediums that can be used for the purpose of the present invention include internal storage devices such as ROMs and RAMs that can be installed in a computer, portable type recording mediums such as CD-ROMs, flexible disks, DVDs mangeto-optical disks and IC cards, data bases for holding computer programs, external computers and their data bases and transmission mediums on transmission lines.

Now, the corresponding relationship between the constituent element in the claims and those of the above-described embodiment will be discussed below. The erasure judging section in claim 1 corresponds to the erasure judging section 3*a*3 of the error-correcting circuit 3*a* for correcting errors that do not involve erasure of the embodiment of FIG. 1 and the syndrome generating section in claim 1 corresponds to the syndrome generating section 3*a*2 contained in the error-correcting circuit 3*a* for correcting errors that do not involve erasure of the embodiment of FIG. 1. The erasure correcting section of claim 1 corresponds to the erasure information/syndrome acquiring section 4*a*1, the MPU polynomial computing section 4*a*2, the erasure error value computing section 4*a*3 and the erasure correcting section 4*a*4 of the MPU 4 of the embodiment of FIG. 1. The erasure-free error-correcting section for correcting errors in claim 1 corresponds to the polynomial computing section 3*a*4, the Chien search section 3*a*5 and the error-correcting section 3*a*6 contained in the error-correcting circuit 3*a* for correcting errors that do not involve erasure of the embodiment of FIG. 1.

The syndrome generating step of claim 3 and that of claim 5 correspond to Step S2 where the error-correcting circuit 3*a* for correcting errors that do not involve erasure of the embodiment generates/holds a syndrome as shown in FIG. 2 and the erasure judging step of claim 3 and that of claim 5 correspond to Step S3, where the error-correcting circuit 3*a* for correcting errors that do not involve erasure of the embodiment determines "if it corrects errors that involve erasure or not" as shown in FIG. 2. The erasure correcting step of claim 3 and that of claim 5 correspond to the Steps S7 through S10 of the MPU 4 of the embodiment as shown in FIG. 2. The post-erasure-correction syndrome generating step of claim 3 and that of claim 5 correspond to Step S2 where the error-correcting circuit 3*a* for correcting errors that do not involve erasure of the embodiment generates/holds a syndrome as shown in FIG. 2 and the post-erasure-correction error correcting step of claim 3 and that of claim 5 correspond to Steps S4 through S6 of the error-correcting circuit 3*a* for correcting errors that do not involve erasure of the embodiment as shown in FIG. 2.

What is claimed is:

1. An error correction device for correcting errors of a code word according to the code word and erasure information it acquires, the device comprising:
    an erasure judging circuit for judging if the code word involves erasure or not according to the erasure information;
    a syndrome generating circuit for generating a syndrome for the code word;
    a processing unit that executes software for correcting the code word for erasure according to the syndrome generated by the syndrome generating section and the erasure information when the erasure judging section judges that the code word involves erasure and causes the syndrome generating section to generate a syndrome for the code word that is corrected for erasure; and
    an erasure-free error-correcting section that is a hardware for correcting errors that do not involve erasure according to the syndrome generated by the syndrome generating section, wherein when the erasure judging circuit judges that the code word involves erasure, the syndrome generating circuit first generates a syndrome for the acquired code word and delivers the outcome to the processing unit, and further generates a post-erasure-correction syndrome for the code word corrected by the processing unit and delivers the outcome to the erasure-free error-correcting section, and the erasure-free error-correcting section performs post-erasure-correction error correcting according to the post-erasure-correction syndrome.

2. The device according to claim 1, wherein when the erasure judging circuit judges that the code word does not involve erasure, the syndrome generating circuit generates a syndrome for the acquired code word and delivers the outcome to the erasure-free error-correcting section.

3. The device according to claim 1, wherein the erasure-free error-correcting section carries out the computation of an error locator polynomial and an error evaluator polynomial and Chien search according to the syndrome generated by the syndrome generating section.

4. The device according to claim 1, wherein the erasure correcting section carries out the computation of an error locator polynomial and an error evaluator polynomial according to the syndrome generated by the syndrome generating section and the erasure information.

5. A computer-readable medium storing an error correction program for causing a computer to correct errors of a code word according to the code word and erasure information it acquires, the program comprising:
- a syndrome generating step that causes a syndrome generating circuit to generate a syndrome for the code word;
- an erasure judging step that causes an erasure judging circuit to judge if the code word involves erasure or not according to the erasure information;
- an erasure correcting step that causes a processing unit to correct the erasure according to the syndrome generated from the code word and the erasure information when the erasure judging step judges that the code word involves erasure;
- a post-erasure-correction syndrome generating step that causes the syndrome generating circuit to generate a syndrome for the code word corrected by the erasure correcting step; and
- a post-erasure-correction error correcting step that causes an error-correcting circuit to correct the errors of the code word corrected by the erasure correcting step according to the syndrome generated by the post-erasure-correction syndrome generating step.

6. The computer-readable medium according to claim 5, the program further comprising:
- an erasure-free error-correcting step that causes the hardware for correcting errors that do not involve erasure to correct the errors of the code word according to the syndrome generated by the syndrome generating step when the erasure judging step judges that the code word does not involve erasure.

7. The computer-readable medium according to claim 5, wherein
the hardware for correcting errors that do not involve erasure in the post-erasure-correction error correcting step carries out the computation of an error locator polynomial and an error evaluator polynomial and Chien search according to the syndrome generated by the syndrome generating step.

8. The computer-readable medium according to claim 5, wherein
the hardware for correcting errors that do not involve erasure in the erasure-free error correcting step carries out the computation of an error locator polynomial and an error evaluator polynomial and Chien search according to the syndrome generated by the syndrome generating step or the syndrome regenerating step.

9. The computer-readable medium according to claim 5, wherein
the erasure correcting step carries out the computation of an error locator polynomial and an error evaluator polynomial according to the syndrome generated by the syndrome generating step and the erasure information.

10. An error correction method executed by a processing unit for correcting errors of a code word according to the code word and the erasure information it acquires, the method comprising:
- a syndrome generating step that causes a syndrome generating circuit to generate a syndrome for the code word;
- an erasure judging step executed by an erasure judging circuit that judges if the code word involves erasure or not according to the erasure information;
- an erasure correcting step executed by the processing unit that corrects the erasure according to the syndrome generated from the code word and the erasure information when the erasure judging step judges that the code word involves erasure;
- a post-erasure-correction syndrome generating step that causes the syndrome generating circuit to generate a syndrome for the code word corrected by the erasure correcting step; and
- a post-erasure-correction error correcting step that causes an error-correcting circuit to correct the errors of the code word corrected by the erasure correcting step according to the syndrome generated by the post-erasure-correction syndrome generating step.

11. The method according to claim 10, further comprising:
- an erasure-free error-correcting step that causes the hardware for correcting errors that do not involve erasure to correct the errors of the code word according to the syndrome generated by the syndrome generating step when the erasure judging step judges that the code word does not involve erasure.

12. The method according to claim 10, wherein
the hardware for correcting errors that do not involve erasure in the post-erasure-correction error correcting step carries out the computation of an error locator polynomial and an error evaluator polynomial and Chien search according to the syndrome generated by the syndrome generating step.

13. The method according to claim 10, wherein
the hardware for correcting errors that do not involve erasure in the erasure-free error correcting step carries out the computation of an error locator polynomial and an error evaluator polynomial and Chien search according to the syndrome generated by the syndrome generating step or the syndrome regenerating step.

14. The method according to claim 10, wherein
the erasure correcting step carries out the computation of an error locator polynomial and an error evaluator polynomial according to the syndrome generated by the syndrome generating step and the erasure information.

* * * * *